(12) United States Patent
Han et al.

(10) Patent No.: US 8,917,107 B2
(45) Date of Patent: Dec. 23, 2014

(54) CIRCUIT BOARD HAVING BYPASS PAD

(75) Inventors: Sang-Guk Han, Hwaseong-si (KR); Seok-Joon Moon, Seongnam-si (KR); Beom-jun Jin, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 293 days.

(21) Appl. No.: 13/563,258

(22) Filed: Jul. 31, 2012

(65) Prior Publication Data

US 2012/0292091 A1 Nov. 22, 2012

Related U.S. Application Data

(63) Continuation of application No. 12/837,649, filed on Jul. 16, 2010, now Pat. No. 8,248,093, which is a continuation of application No. 12/204,735, filed on Sep. 4, 2008, now Pat. No. 7,872,483.

(30) Foreign Application Priority Data

Dec. 12, 2007 (KR) .......................... 10-2007-0129057

(51) Int. Cl.
| | |
|---|---|
| *G01R 31/00* | (2006.01) |
| *G01R 31/28* | (2006.01) |
| *H01L 23/538* | (2006.01) |
| *H05K 1/02* | (2006.01) |
| *H01L 21/66* | (2006.01) |
| *H01L 23/00* | (2006.01) |
| *H01L 25/065* | (2006.01) |
| *H01L 25/18* | (2006.01) |
| *H05K 1/11* | (2006.01) |
| *H05K 3/28* | (2006.01) |
| *H05K 3/32* | (2006.01) |

(52) U.S. Cl.
CPC .......... *G01R 31/2818* (2013.01); *H01L 23/538* (2013.01); *H05K 1/0268* (2013.01); *H01L 22/30* (2013.01); *H01L 24/80* (2013.01); *H01L 25/0655* (2013.01); *H01L 25/0657* (2013.01); *H01L 25/18* (2013.01); *H01L 2224/48145* (2013.01); *H01L 2224/48227* (2013.01); *H01L 2225/06562* (2013.01); *H01L 2225/06568* (2013.01); *H01L 2225/06596* (2013.01); *H05K 1/117* (2013.01); *H05K 3/28* (2013.01); *H05K 3/323* (2013.01); *H05K 2203/162* (2013.01); *H01L 24/48* (2013.01)
USPC ............ 324/756.07; 324/754.07; 324/756.05; 361/748; 361/777

(58) Field of Classification Search
CPC . G01R 31/2818; H05K 1/0268; H05K 1/117; H05K 3/28
See application file for complete search history.

(56) References Cited

U.S. PATENT DOCUMENTS

| | | |
|---|---|---|
| 6,373,267 B1 | 4/2002 | Hiroi |
| 6,404,649 B1 | 6/2002 | Drake et al. |

(Continued)

OTHER PUBLICATIONS

Office Action issued on Apr. 3, 2014 in the Chinese Patent Office.

(Continued)

*Primary Examiner* — Minh N Tang
(74) *Attorney, Agent, or Firm* — Muir Patent Consulting, PLLC

(57) ABSTRACT

An electronic device having a printed circuit board is provided. In one embodiment, the printed circuit board includes a plurality of external pads to be coupled with an external device and a plurality of bypass pads for testing an electric circuit. The external pads are exposed and at least one of the plurality of bypass pads are not exposed from an outer surface of the PCB. A system using the electronic device and a method of testing an electronic device are also provided.

19 Claims, 14 Drawing Sheets

(56) References Cited

U.S. PATENT DOCUMENTS

| | | |
|---|---|---|
| 6,803,658 B2 | 10/2004 | Suzuki |
| 7,048,197 B2 | 5/2006 | Nishizawa et al. |
| 7,053,471 B2 | 5/2006 | Wada et al. |
| 7,055,757 B2 | 6/2006 | Nishizawa et al. |
| 7,233,058 B2 | 6/2007 | Wada et al. |
| 7,234,644 B2 | 6/2007 | Nishizawa et al. |
| 7,359,204 B1 | 4/2008 | Jang et al. |
| 7,872,483 B2 | 1/2011 | Han et al. |
| 8,013,332 B2 | 9/2011 | Middlekauff et al. |
| 2005/0013106 A1 | 1/2005 | Takiar |
| 2006/0163740 A1 | 7/2006 | Ohno et al. |
| 2007/0152312 A1* | 7/2007 | Tang et al. ............ 257/686 |

OTHER PUBLICATIONS

Preliminary Notice of the First Office Action dated Jun. 13, 2012 from the Taiwan Intellectual Property Office.

* cited by examiner

CIRCUIT BOARD HAVING BYPASS PAD

CROSS-REFERENCE TO RELATED PATENT APPLICATIONS

This application claims the benefit of priority to and is a Continuation of U.S. patent application Ser. No. 12/837,649, filed Jul. 16, 2010, now issued as U.S. Pat. No. 8,248,093, which claims the benefit of priority to and is a Continuation of U.S. patent application Ser. No. 12/204,735, filed Sep. 4, 2008, and now issued as U.S. Pat. No. 7,872,483, which claims the benefit of priority to Korean Patent Application No. 10-2007-0129057, filed on Dec. 12, 2007 in the Korean Intellectual Property Office, the disclosure of each of which is incorporated herein in its entirety by reference.

SUMMARY

The present inventive concept provides an electronic device having a printed circuit board, a system including the electronic device, and a method of testing the electronic device.

According to some embodiments of the present inventive concept, a printed circuit board (PCB) includes: a plurality of external pads to be coupled with an external device; and a plurality of bypass pads for testing an electric circuit. The external pads can be exposed from an outer surface of the PCB and at least one of the plurality of bypass pads may not be exposed from an outer surface of the PCB. The bypass pads may be contained wholly within the PCB. Also, the bypass pads and the external pads may be disposed adjacent to the same side of the PCB.

In some embodiments, a PCB comprises a core insulator having a first surface and a second surface opposite the first surface; bypass pads for testing an electrical circuit, the bypass pads formed on the first surface of the core insulator; external pads to be coupled with an external device, the external pads formed on the first surface of the core insulator; and a solder resist (SR) layer exposing the external pads and covering at least one of the bypass pads.

In some embodiments, a method for testing an electric circuit includes providing a printed circuit board (PCB) comprising: a plurality of external pads to be coupled with an external device; and a plurality of bypass pads for testing an electric circuit, wherein the external pads are exposed and one or more of the bypass pads are not exposed from an outer surface of the PCB; removing a portion of the PCB to expose at least one of the plurality of bypass pads; and testing the electric circuit via the at least one of the plurality of bypass pads.

In some embodiments, a method of forming a printed circuit board (PCB), comprises providing a core insulator; forming external pads and bypass pads on a surface of the core insulator; and forming a solder resist layer on the surface of the core insulator, wherein the solder resist layer exposes the external pads and covers at least one of the bypass pads.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION

Figure 1:
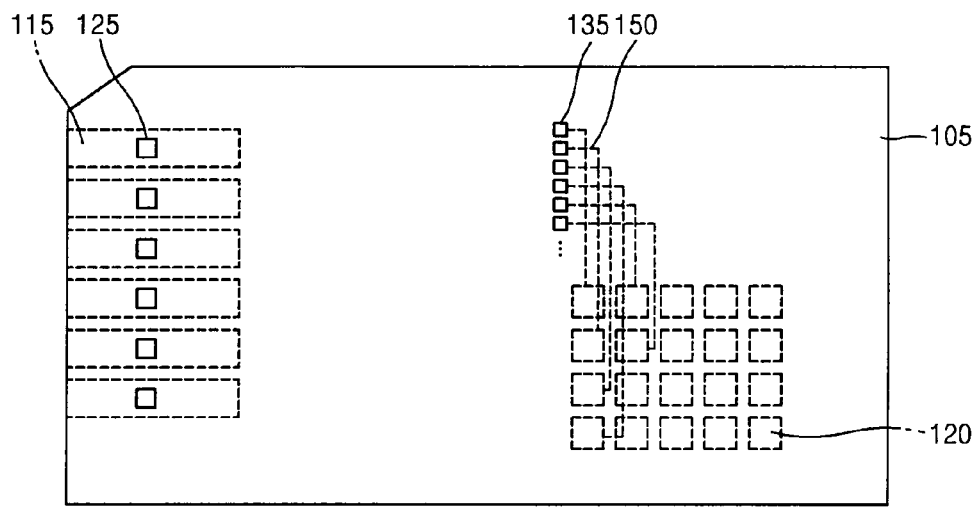
FIG. 1 is a plan view of a printed circuit board (PCB)
Figure 24:
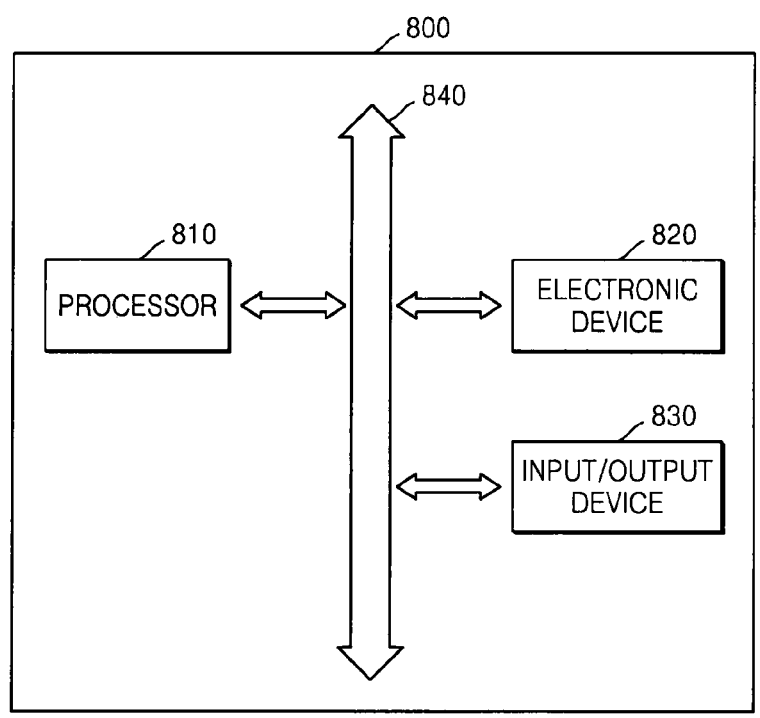
FIG. 24 is a diagram of another system using an electronic device according to some embodiments of the present inventive concept.

Referring to FIG. 1, in one embodiment, a printed circuit board (PCB) 100 includes external pads 115 on an insulating substrate 105 and bypass pads 120 within the insulating substrate 105. The external pads 115 are used to interconnect an external device such as a digital camera, electronic game machines, a cellular phone or a personal computer with semiconductor chips mounted on the PCB 105 such that signals can be communicated therebetween. The PCB 100 can be used in multiple applications including an electronic device such as a solid state disk (SSD) as shown in FIG. 24, a memory card, or a System-in-Package (SIP) semiconductor device, among other things. The electronic device may include two or more types of semiconductor chips, such as a memory chip and a logic chip. To ensure the reliability of the semiconductor chips after the chips are packaged and/or the electronic device is manufactured, a testing process is performed. Also, there are various other occasions where the testing process is desired, e.g., during the development of the electronic device.

In order to facilitate testing, it is helpful for the electronic device, e.g., SIP, to include the bypass pads 120, which may also be referred to as test pads, in addition to the external pads 115. The bypass pads 120 can be useful especially when electronic devices containing a semiconductor chip, such as memory cards, are very small. The bypass pads 120 may be used to test the memory chips inside the electronic devices. Consequently, during the normal manufacturing process or when specific test steps are triggered, the memory chips may be tested even though the controller chip is not working properly.

If the bypass pads 120 are exposed externally from a surface of the insulating substrate 105 or the PCB 100, an insulating tape may need to be applied to protect the exposed bypass pads from the external environment. However, in normal use, the insulating tape can be peeled off or damaged and thereby expose all or a portion of the bypass pads 120 to the external environment. When the bypass pads 120 are exposed to the external environment, shorts between respective ones of the bypass pads 120 and malfunctions of the electronic device can occur.

Figure 2:
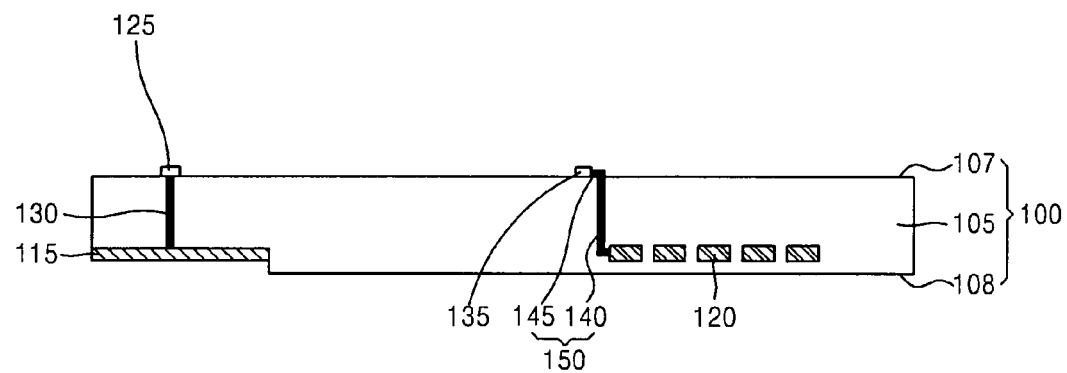
FIG. 2 is a cross-section view of the PCB shown in FIG. 1 according to a first embodiment of the present inventive concept.

FIG. 2 is a cross-section view of the PCB shown in FIG. 1 according to one embodiment of the present inventive concept to deal with such issues.

Referring to FIG. 2, a PCB 100 according to some embodiments of the inventive concept includes an insulating substrate 105 having a first surface 107 and a second surface 108 opposite to the first surface 107. The insulating substrate 105 may include a rigid or flexible substrate including a single dielectric layer or multiple dielectric layers. The PCB 100 also includes external pads 115 disposed adjacent the second surface 108 and bypass pads 120 disposed between the first surface 107 and the second surface 108. In one embodiment, the bypass pads 120 may be adjacent and closer to the second surface 108 than to the first surface 107 as shown. Accordingly, the bypass pads may be contained wholly within the insulating substrate 105. Also, the bypass pads 120 and the external pads 115 may be disposed adjacent to the same side of the PCB 100 or the insulating substrate 105.

The external pads 115 may be formed on the second surface 108 or disposed within a recess formed in the insulating substrate 105. As a result, the external pads 115 may be exposed from the second surface 108 to be coupled to an external device such as various electronic devices including a lap top computer, a personal digital assistant (PDA) and electronic game machines.

In one embodiment, the bypass pads 120 may be formed, for example, on a second surface of a core insulator (not illustrated in FIG. 2 but shown in FIG. 20 as 106) adjacent to the second surface 108 of the PCB 100 or the insulating substrate 105. The PCB 100 may have a solder resist layer (not illustrated in FIG. 2. but shown in FIG. 20 as element 124) on the core insulator. The solder resist layer may include openings respectively exposing corresponding ones of the bypass pads 120 as will be explained later with respect to FIG. 20C.

The external pads 115 can be connected to one or more first terminal pads 125 on an upper surface, i.e., the first surface 107 of the insulating substrate 105 or PCB 100 through one or more first via plugs 130. Also, various other electrical connection methods can be used to interconnect the external pads 115 and the one or more first terminal pads 125.

The bypass pads 120 can also be connected to one or more second terminal pads 135 on the first surface 107 using one or more second via plugs 140 and/or wiring patterns 145 (collectively referred to as "circuit pattern 150").

The bypass pads 120 can be sealed from the external environment by, for example, the insulating substrate 105. The insulating substrate 105 may include a photoresist material. In particular, materials that make up the PCB 100 may substantially surround the bypass pads 120. The bypass pads 120 may be disposed in a region of the PCB 100 in which all surfaces of the bypass pads are surrounded by the PCB 100.

Thus, according to some embodiments of the present inventive concept, the bypass pads 120 are protected from the external environment, leading to increased reliability of the PCB 100 and electronic devices including the PCB 100. Even when stress or an external impact is inadvertently applied to the PCB 100 or the electronic devices including the PCB 100, as the bypass pads 120 are disposed within the insulating substrate 105 or within the PCB 100, the bypass pads 120 can be securely protected. It should be noted that the present inventive concept has application to both volatile and nonvolatile electronic devices. In other words, the semiconductor chips discussed above can be provided as, for example, a DRAM, a PRAM, an MRAM, a nonvolatile memory, or the like or a combination thereof.

Figure 3:
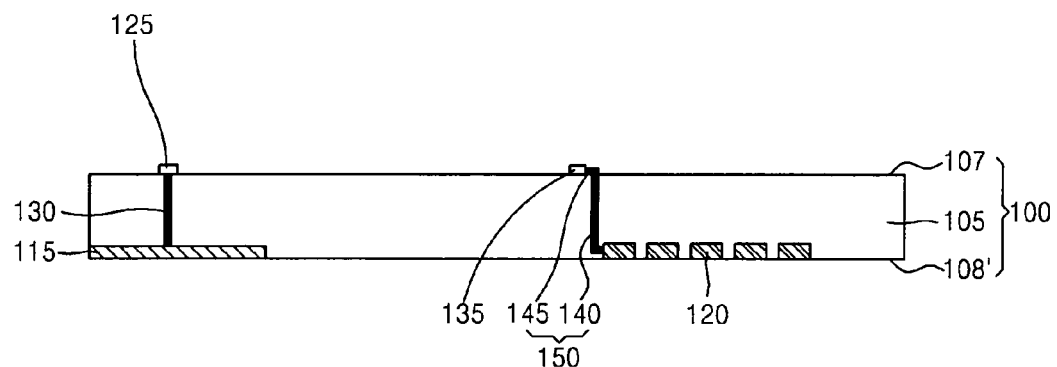
FIG. 3 is a cross-section view of a PCB according to a second embodiment of the present inventive concept.

FIG. 3 is a cross-section view of a PCB according to another embodiment of the present inventive concept.

Referring to FIG. 3, from time to time in the electronic device manufacturing process or after manufacturing is complete; it may become necessary to test the semiconductor chips on a PCB 100. In this case, the second surface 108 of the insulating substrate 105 can be partially removed such that one or more of the bypass pads 120 are exposed from the PCB 100. The exposed bypass pads 120 can then be used to test the semiconductor chips. The bypass pads 120 can be exposed using several methods including dry etching, wet etching, and/or planarization of the second surface 108. The planarization may be performed using an etch back process or a chemical mechanical polishing (CMP) process.

After the testing procedure, the removed portion of the second surface 108 can be restored if desired by, for example, depositing a layer of photoresist.

The number of bypass pads 120 and the external pads 115 can be decided based on the desired application for the PCB 100. As shown, the bypass pads 120 can be arranged in a matrix form.

Figure 4:
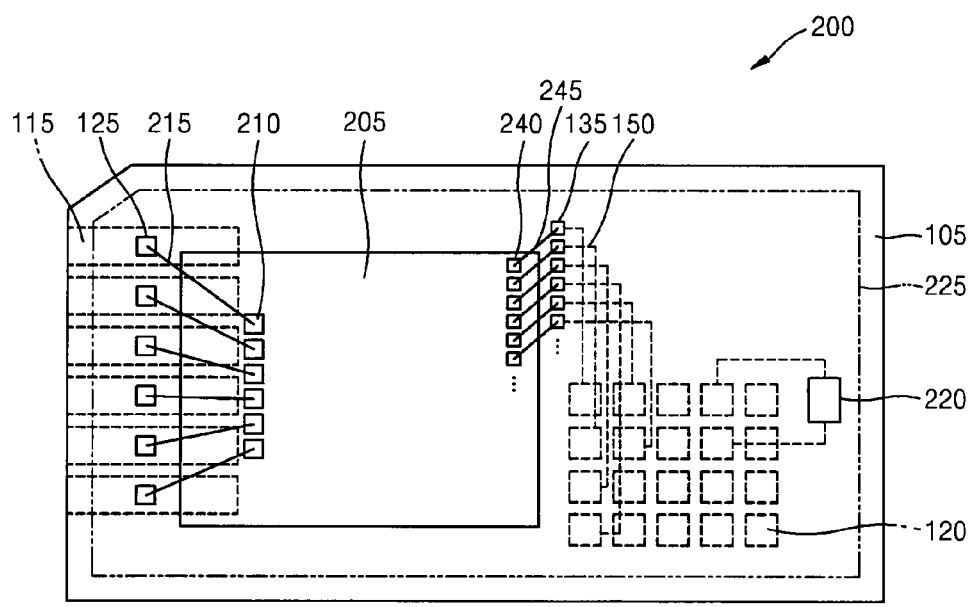
FIGS. 4 and 5 are plan and cross-section views of an electronic device, respectively, in accordance with a third embodiment of the present inventive concept.
Figure 5:
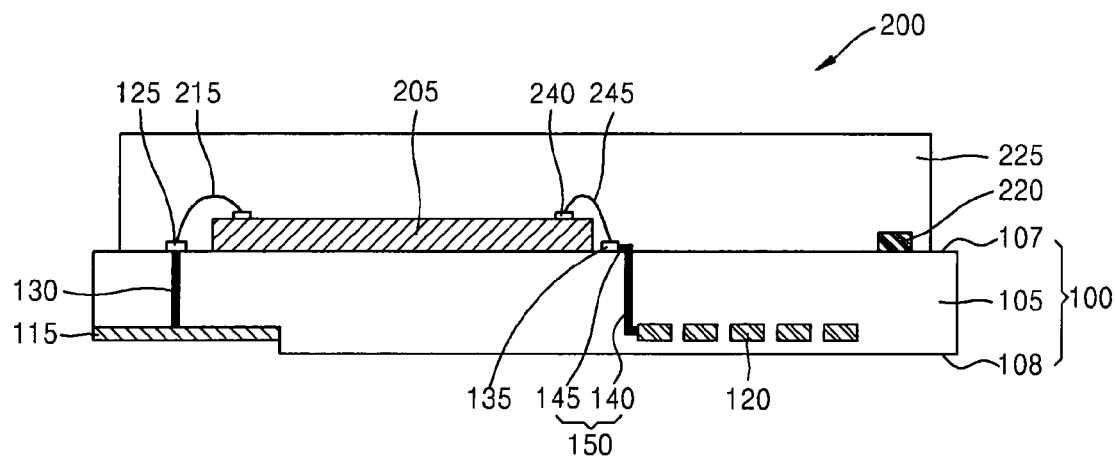

FIGS. 4 and 5 are plan and cross-section views of an electronic device, respectively, in accordance with some embodiments of the present inventive concept.

Referring to FIGS. 4 and 5, an electronic device 200 includes a semiconductor chip 205 disposed on a first surface 107 of an insulating substrate 105. The electronic device 200 can be a memory card or the like and the semiconductor chip 205 can be, for example, a memory chip or a logic chip (or a controller chip). The semiconductor chip 205 can be electrically connected to external pads 115 and/or bypass pads 120. The external pads 115 can be used for transferring signals between semiconductor chip 205 and components external to the electronic device 200, e.g., an external device such as a digital camera and so on. Bypass pads 120 can be used for routine testing and/or failure analysis of the semiconductor chip 205.

The semiconductor chip 205 can include one or more sets of chip pads 210 and 240. The sets of chip pads 210, 240 can be coupled to first and second terminal pads 125, 135, respectively, using connection means such as bonding wires 215, 245. The ends of the bonding wires 215, 245 can be connected to the chip pads 210, 240 and the first and second terminal pads 125, 135. The sets of chip pads 210, 240 may be coupled to the first and second terminal pads 125, 135 using conductive bumps or conductive through vias.

In one embodiment, one or more passive devices such as a capacitor, resistor or inductor are formed on the first surface of the insulating substrate 105.

In some embodiments, an encapsulant 225 formed of a material such as an epoxy molding compound (EMC) can be formed to cover the semiconductor chip 205. In FIG. 4, the encapsulant 225 is shown as a dotted line. The encapsulant 225 may also be formed of a ceramic material or the encapsulant 225 may be a casing formed of a material such as metal.

The electronic device 200 can be electrically connected to an external device such as various electronic devices, using external pads 115. In normal use, the bypass pads 120 can be safely protected within the insulating substrate 105. However, as discussed above, when there is a need for testing the electronic device 200 or the semiconductor chip 205, the bypass pads 120 can be exposed for testing.

Figure 6:
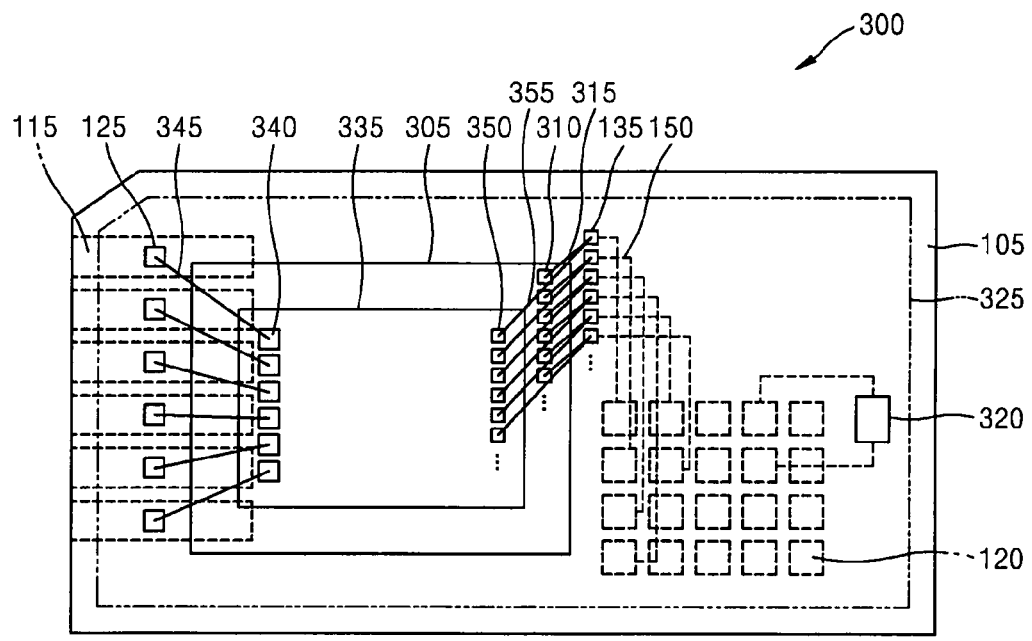
FIGS. 6 and 7 are plan and cross-section views of an electronic device, respectively, in accordance with a fourth embodiment of the present inventive concept.
Figure 7:
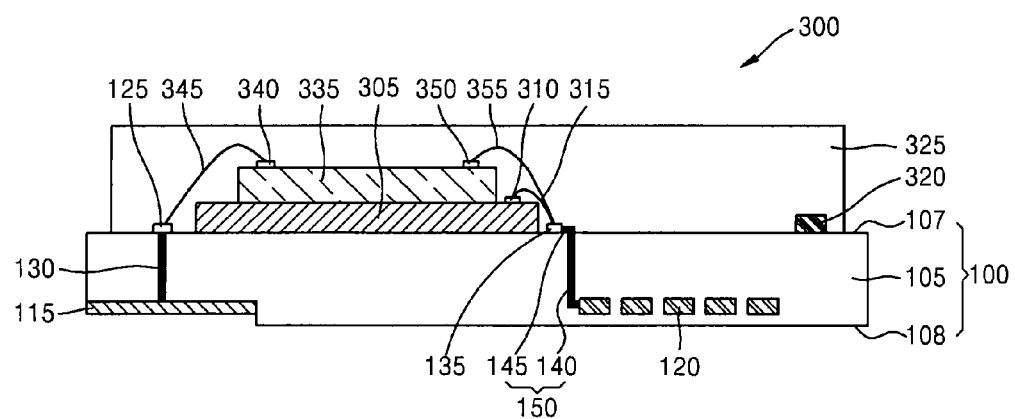

FIGS. 6 and 7 are plan and cross-section views of an electronic device, respectively, in accordance with one embodiment of the present inventive concept. The embodiments shown in FIGS. 7 and 8 include features similar to that described above with respect to FIGS. 5 and 6. Therefore, in the interest of brevity, redundant description will be omitted.

Referring to FIGS. 6 and 7, an electronic device 300 can include a memory chip 305 and a logic chip 335 stacked on a first surface 107 of an insulating substrate 105. The memory chip 305 can include various types of memory devices such as flash memory, DRAM, SRAM, PRAM (phase change RAM), and RRAM (resistance RAM). The logic chip 335 can be provided for controlling the memory chip 305 and the memory chip 305 can transfer data responsive to commands from the logic chip 335. The electronic device 300 can be, for example, an MMC (Multimedia card), an SD (secure digital card), a micro MMC, a micro SD, or the like. The external pads 115 may be electrically connected to the logic chip 335 such that the logic chip 335 can exchange signals with an external device.

One or more passive devices 320 can also be provided on the first surface 107 of the insulating substrate 105 of the PCB 100. The passive device 320 can be electrically connected to the bypass pads 120 and include a capacitor, a resistor, and/or an inductor.

In some embodiments, an encapsulant 325 formed of a material such as an epoxy molding compound (EMC) can be formed to cover the semiconductor chip 205.

Figure 8:
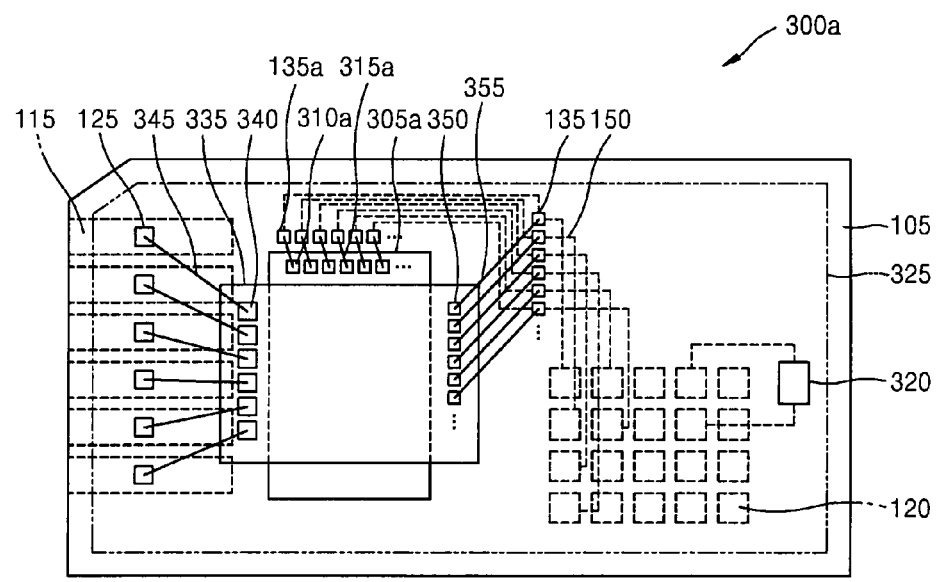
FIG. 8 is a plan view of an electronic device in accordance with a fifth embodiment of the present inventive concept.

FIG. 8 is a plan view of an electronic device in accordance with another embodiment of the present inventive concept.

Referring to FIG. 8, an electronic device 300a includes a memory chip 305a and a logic chip 335 stacked on an insulating substrate 105 of the PCB 100. Chip pads 310a of the memory chip 305a and chip pads 340, 350 of the logic chip 335 can be configured in different directions. Specifically, chip pads 310a of the memory chip 305a can be disposed in a longitudinal direction while chip pads 340, 350 of the logic chip 335 can be disposed in a lateral direction. The chip pads 310a of the memory chip 305a can be connected to third terminal pads 135a, which can be coupled with second terminal pads 135. In this way, bonding wires 315a, 345, 355 of each of the logic chip 335 and the memory chip 305a are disposed in different directions so that electrical shorts between the bonding wires can be avoided.

Figure 9:
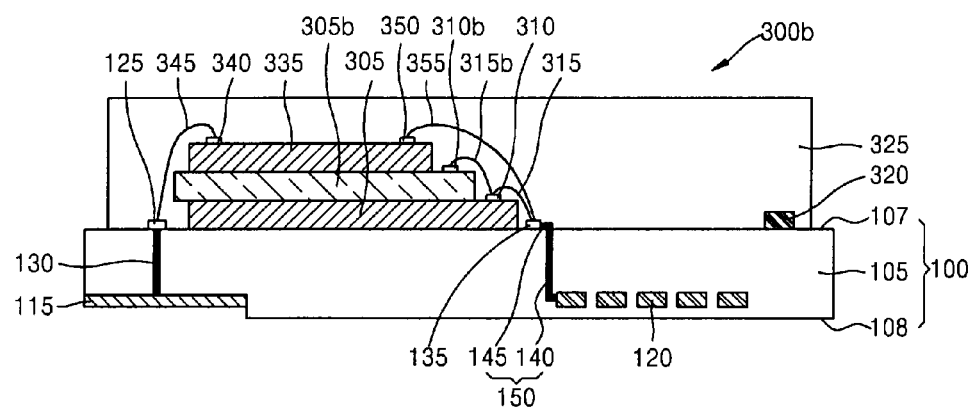
FIG. 9 is a cross-section view of an electronic device in accordance with a sixth embodiment of the present inventive concept.

FIG. 9 is a cross-section view of an electronic device in accordance with still another embodiment of the present inventive concept.

Referring to FIG. 9, an electronic device 300b includes one or more additional memory chips 305b disposed between a memory chip 305 and a logic chip 335. In this case, the logic chip 335 can control the memory chip 305 and the additional memory chips 305b. The additional memory chips 305b can be stacked so as to expose chip pads 310 of the memory chip 305. Accordingly, the chip pads 310b of the additional memory chips 305b can be connected to the chip pads 310 of the memory chip 305 by connection means such as bonding wires 315b. The logic chip 335, the memory chip 305, and the additional memory chips 305b can be electrically connected to the bypass pads 120 via the second terminal pads 135 and the circuit pattern 150.

Figure 10:
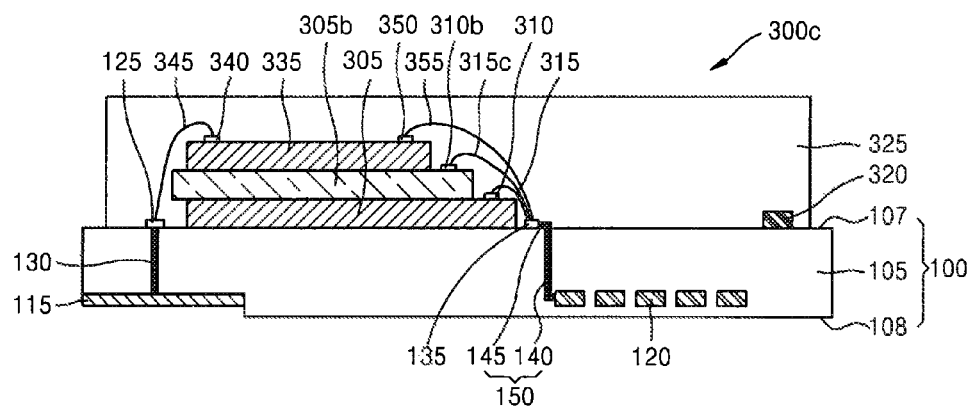
FIG. 10 is a cross-section view of an electronic device in accordance with a seventh embodiment of the present inventive concept.

FIG. 10 is a cross-section view of an electronic device in accordance with some embodiments of the present inventive concept.

Referring to FIG. 10, an electronic device 300c includes one or more additional memory chips 305b disposed between a memory chip 305 and a logic chip 335. Additionally, one or more additional chip pads 310b of the additional memory chips 305b can be directly connected to the second terminal pads 135 by bonding wires 315c, rather than via the memory chip pads 310.

Figure 11:
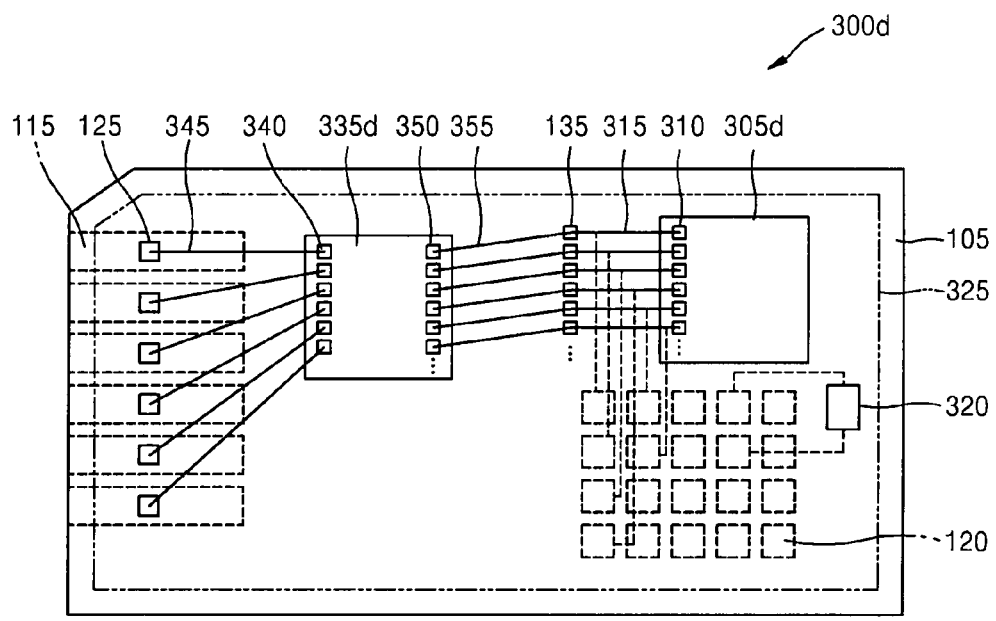
FIGS. 11 and 12 are plan and cross-section views of an electronic device, respectively, in accordance with an eighth embodiment of the present inventive concept.
Figure 12:
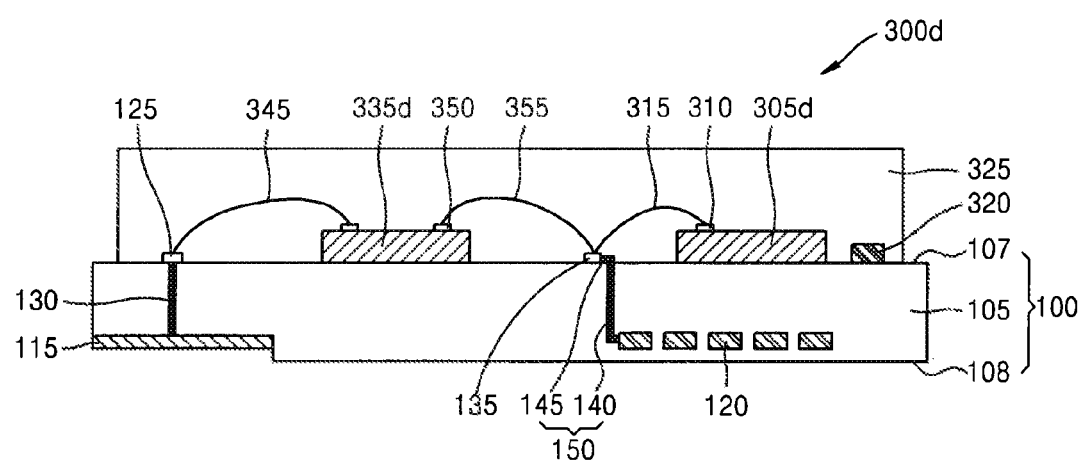

FIGS. 11 and 12 are plan and cross-section views of an electronic device, respectively, in accordance with some embodiments of the present inventive concept.

Referring to FIGS. 11 and 12, an electronic device 300d includes a memory chip 305d and a logic chip 335d both disposed directly on an insulating substrate 105, rather than stacked, as in other embodiments. The logic chip 335d can be configured between first terminal pads 125 and second terminal pads 135. Therefore, bonding wires 345, 355 can be formed on opposite sides of the logic chip 335d. In this way, shorts between the bonding wires 345, 355 can be avoided.

Figure 13:
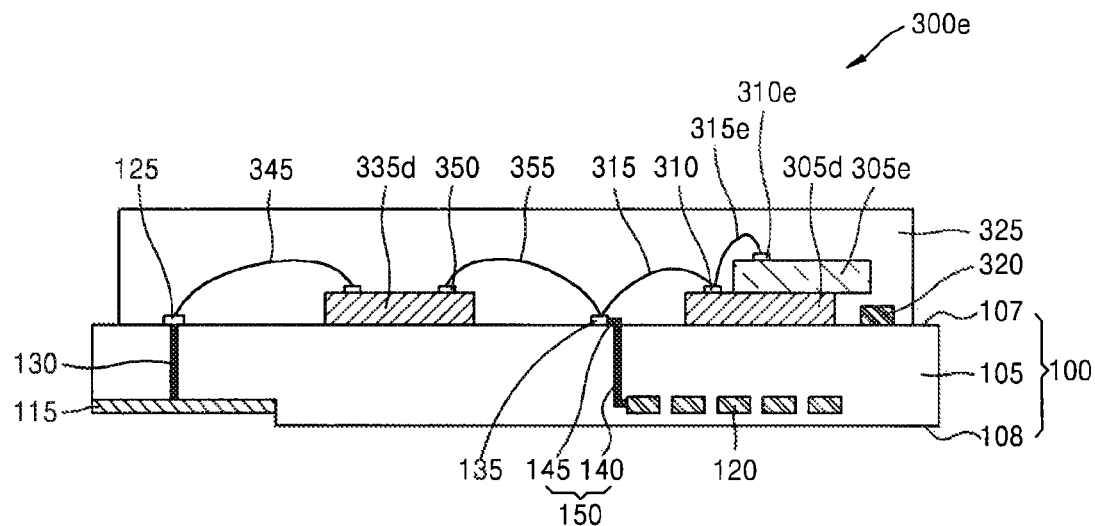
FIGS. 13 and 14 are cross-section views illustrating alternative embodiments of that shown in FIGS. 11 and 12.
Figure 14:
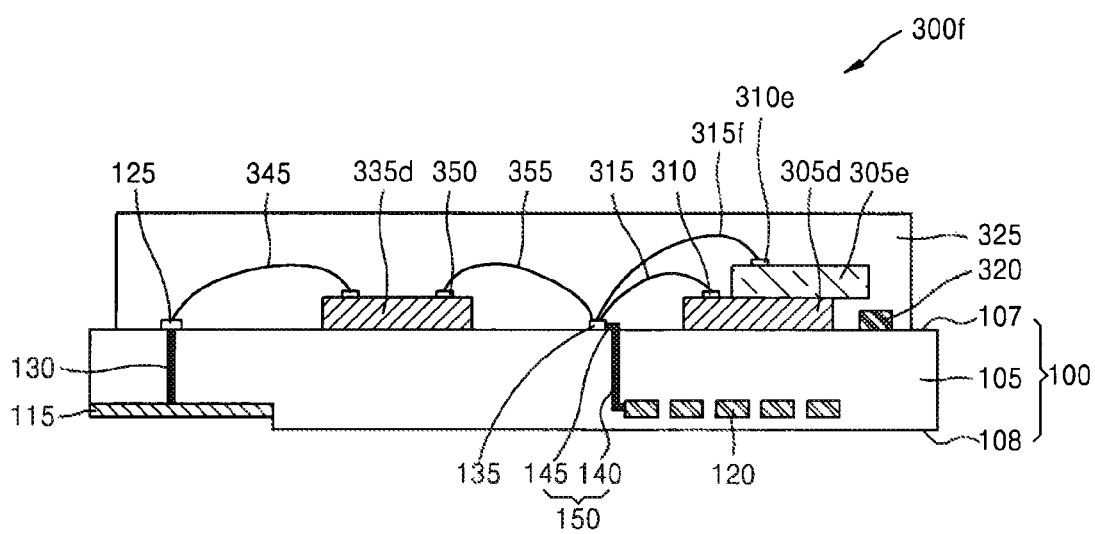

FIGS. 13 and 14 are cross-section views illustrating alternative embodiments of that shown in FIGS. 11 and 12.

Referring to FIGS. 13 and 14, an electronic device 300e can include a memory chip 305d and a logic chip 335d both disposed directly on an insulating substrate 105, and an additional memory chip 305e disposed on the memory chip 305d. The logic chip 335d can control both the memory chip 305d and the additional memory chip 305e. The additional memory chip 305e can be disposed so as to expose the chip pads 310 of the memory chip 305d. Accordingly, the chip pads 310e can be connected to the chip pads 310 of the memory chip 305d by bonding wires 315e (see FIG. 14). Alternatively, the chip pads 310e can be connected directly to the second terminal pads 135 using bonding wires 315f. Further, the logic chip 335d, the memory chip 305d, and the additional memory chip 305e can be electrically connected to the bypass pads 120 by the second terminal pads 135.

Figure 15:
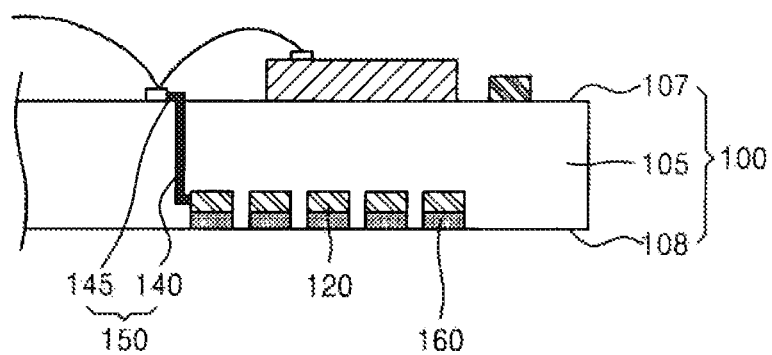
FIGS. 15 through 17 are cross-section views of a bypass pad portion of the electronic device shown in FIG. 13.
Figure 16:
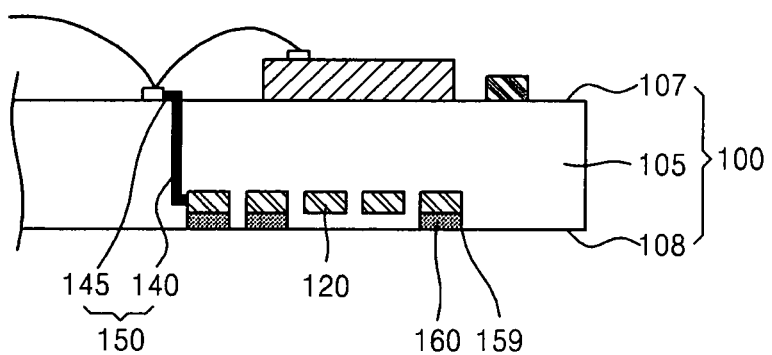
Figure 17:
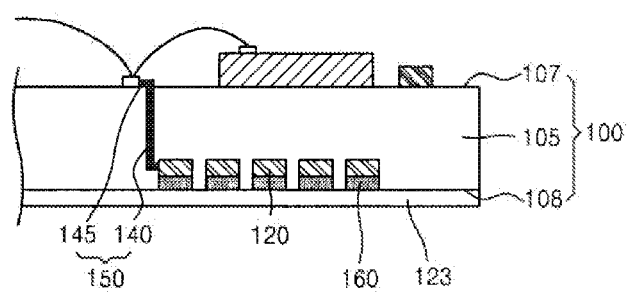

FIGS. 15 through 17 are cross-section views of a bypass pad portion of the electronic device shown in FIG. 13.

Referring to FIGS. 15 and 16, the bypass pads 120 can be protected by an insulating material layer 160 such that the bypass pads 120 are not externally exposed. The insulating material layer 160 can be disposed directly on the bypass pads 120. The insulating material layer 160 can include a material such as an epoxy resin, a via filling material, or an anisotropic conductive film (ACF), as opposed to the solder resist material. When the insulating material layer 160 is formed of an ACF and there is a need for testing a memory chip in the electronic device, a testing tip can be placed so as to exert pressure on the ACF to cause it to be electrically connected to the bypass pads 120 as will be discussed further with respect to FIG. 21. Because there is no need for an additional process to expose the bypass pads 120, the manufacturing costs and time can be substantially reduced.

On the other hand, if the bypass pads 120 are formed of copper, the insulating material layer 160 can be directly formed on a bare surface of the copper. Thus, no Ni-gold plating is required as a seed layer. As a result, the manufacturing costs in terms of material costs and process time can be reduced.

Also, compared to prior art methods where the insulating tape is used over the bypass pads, the insulating material layer 160 is less likely to peel off and expose the bypass pads 120 to the external environment.

The insulating material layer 160 may include a dielectric material having an etch selectivity with respect to the solder resist layer adjacent to the second surface 108 of the PCB 100 next to the insulating material layer 160. Accordingly, the insulating material layer 160 may be removed more easily than a photo solder resist (PSR) material by chemical and/or mechanical methods such as etching and polishing. In the case of PSR, as PSR is a hard material, the etching of PSR requires a strong chemical etchant such as nitric acid or sulfuric acid. Consequently, the strong chemical etchant can etch other insulating materials, resulting in short circuits. By using the insulating material layer 160, which is easier to remove, these problems, such as short circuits, can be reduced.

As shown in FIG. 16, the insulating material layer 160 can be disposed on only a portion of the total number of bypass pads 120, as desired. In other words, the insulating substrate 105 includes one or more openings 159 exposing a portion of the bypass pads 120. The one or more openings 159 are filled with the insulating material layer 160 having an etch selectivity with the insulating substrate 105, e.g., a solder resist layer that forms the insulating substrate 105.

An additional solder resist layer may be formed on the second surface 108 of the PCB 100 so as to cover the solder resist layer and the insulating material layer 160 as in FIG. 17.

Referring further to FIG. 17, the insulating material layer 160 can be disposed inside of the PCB 100 (i.e., under the second surface 108 of the PCB 100) and/or under an additional solder resist layer 123 formed on the second surface 108 of the PCB 100. In this case, to expose the bypass pads 120, mechanical polishing and chemical etching can be applied sequentially.

Figure 18:
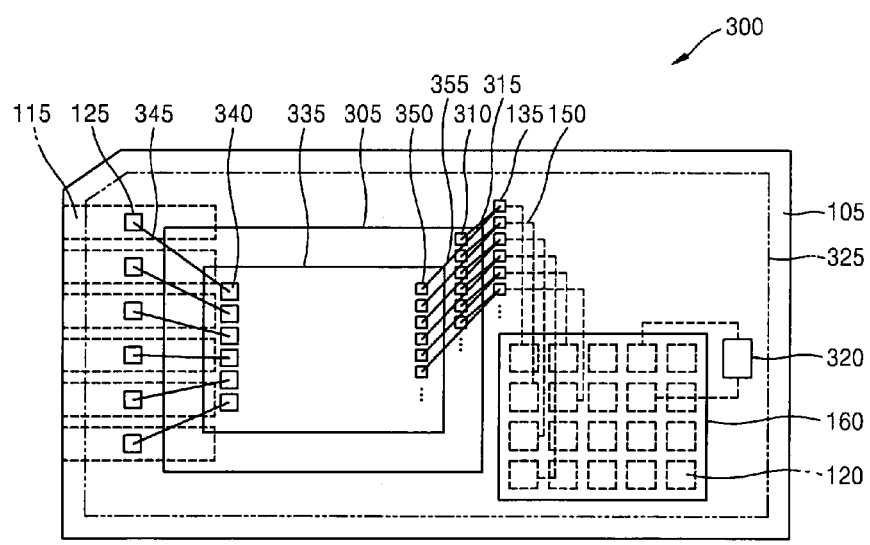
FIG. 18 is a plan view illustrating an insulating material layer covering a bypass pad region of a surface of a PCB according to one embodiment.
Figure 19:
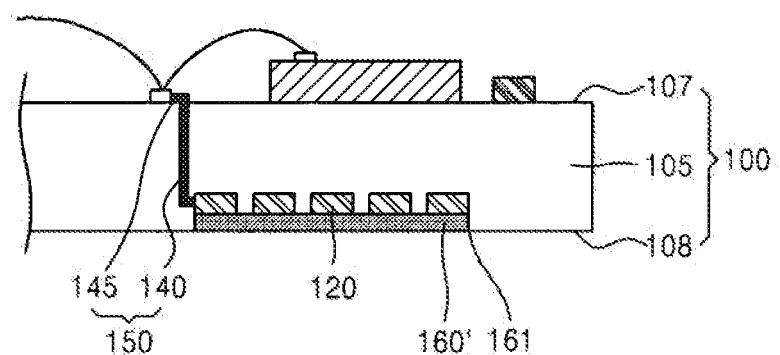
FIG. 19 is a cross-section view of a bypass pad portion of the electronic device shown in FIG. 18.

FIG. 18 is a plan view illustrating an insulating material layer covering a bypass pad region of a surface of a PCB. FIG. 19 is a cross-section view of a bypass pad portion of the electronic device shown in FIG. 18.

In FIG. 17, the insulating material layer 160 is formed over the individual bypass pads 120, rather than over the regions between the bypass pads 120. However, as shown in FIGS. 18 and 19, a single insulating material layer 160' can be disposed over the plural bypass pads 120 including the regions between the bypass pads 120. In other words, there may be a single opening 161 in a portion of the insulating substrate 105 overlying a plurality of bypass pads 120, not just over an individual bypass pad 120. And the single insulating material layer 160 may be disposed in the single opening 161 to be disposed over the plurality of bypass pads 120. The other portion of the insulating substrate 105 comprises an SR layer in a region where the single insulating material layer 160' is not formed although the SR layer is not separately illustrated in FIG. 19. The single insulating material layer 160' may be formed of a dielectric material having an etch selectivity with respect to the SR layer. The SR layer may be seen to include a single opening 161 to be disposed over the plurality of bypass pads 120. In other words, the SR layer may include the single opening 161 exposing a plurality of the bypass pads 120.

In one embodiment, the single insulating material layer 160' may be formed of a material similar to the insulating material layer 160 of, for example, FIG. 17.

Figure 20A:
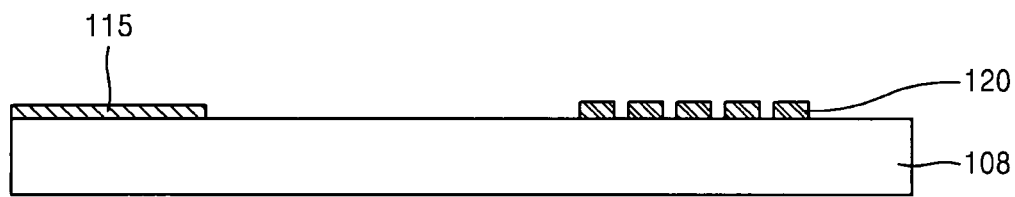
FIGS. 20A-20C are cross-section views illustrating a method of manufacturing a PCB including bypass pads, according to some embodiments of the present inventive concept.
Figure 20B:
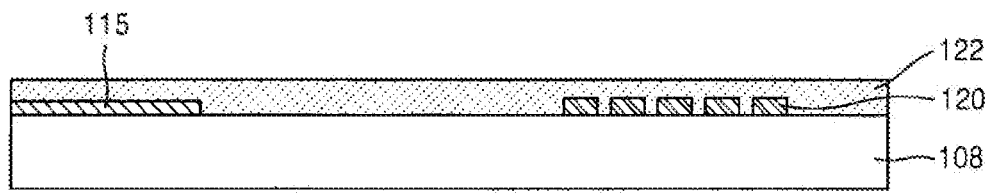
Figure 20C:
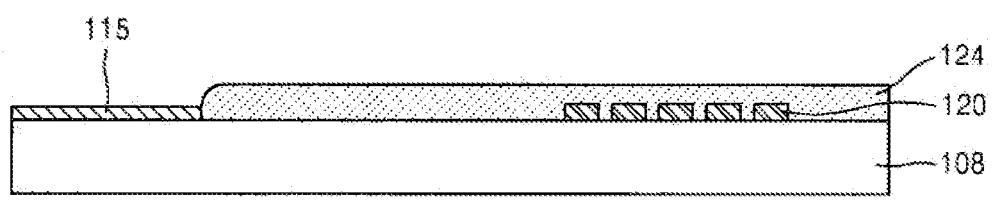

FIGS. 20A-20C are cross-section views illustrating a method of manufacturing a PCB including bypass pads, according to some embodiments of the present inventive concept.

Referring to FIG. 20A, a method of manufacturing a PCB includes providing a core insulator 106. The core insulator 106 may include, but not limited to, a BT resin material. Next, a conductive pattern is formed on the core insulator 106. The conductive pattern includes the external pads 115 and the bypass pads 120. Forming the conductive pattern may include forming a conductive material layer and then patterning the conductive material layer (using a photolithography process, for example) to form the external pads 115 and the bypass pads 120.

Referring to FIG. 20B, a dielectric layer 122 is formed over substantially an entire surface of the core insulator 106, including the external pads 115 and the bypass pads 120. The dielectric layer 122 may be a solder resist, and more specifically, may be a photo solder resist (PSR).

Referring to FIG. 20C, a portion of the dielectric layer 122 is removed to form a solder resist layer 124. Removal of the portion of the dielectric layer 122 may include a photolithography process. The external pads 115 are exposed by the solder resist layer 124. The bypass pads 120 may not be exposed (or covered) by the solder resist layer 124. Alternatively, some of the bypass pads 120 may be exposed by the solder resist layer 124 and others of the bypass pads 120 may not be exposed or covered by the solder resist layer 124. Although not shown for the sake of simplicity, other conventional PCB materials may be formed on the core insulator 106. For example, another photoresist layer is formed on other side of the core insulator 106 opposite the solder resist layer 124.

In one embodiment, the insulating substrate 105 shown throughout the drawings including FIGS. 15-17 may have a structure similar to the structure shown in FIG. 20C. In other words, the insulating substrate 105 may include a core insulator with the bypass pads 120 formed thereon while the solder resist layer covering the bypass pads and the core insulator as shown in FIG. 20C, for example. However, the present invention is not limited to this particular structure and can be applied to any other suitable PCB structure within the spirit and scope of the present invention.

Also, some or all of the features discussed with respect to a particular drawing or an embodiment can be also applied to other embodiments or drawings.

Figure 21:
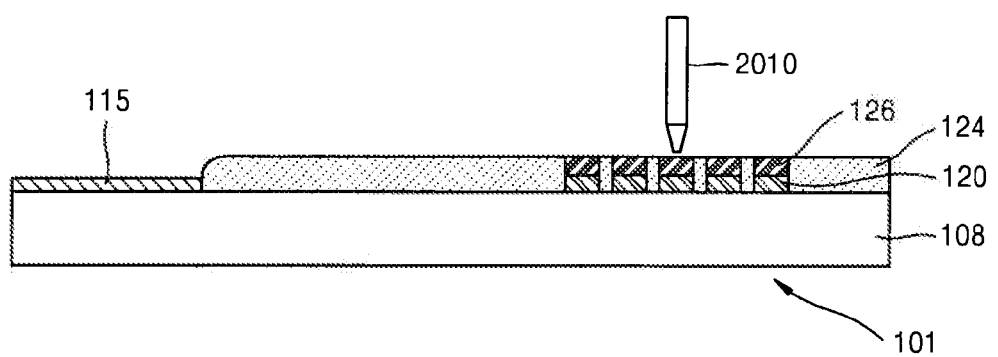
FIG. 21 is a cross-section view of a PCB having bypass pads with an ACF, according to some embodiments of the present inventive concept.

FIG. 21 is a cross-section view of a PCB having bypass pads with an ACF, according to some embodiments of the present inventive concept discussed above with respect to FIGS. 15-16.

Referring to FIG. 21, a PCB 101 includes a core insulator 106, external pads 115, bypass pads 120, and a solder resist layer 124 in accordance with one embodiment of the present invention. The external pads 115 are exposed from the solder resist layer 124. The bypass pads 120 are also exposed from the solder resist layer 124, but in this case, an anisotropic conductive film (ACF) 126 covers the bypass pads 120. Using the ACF 126, a test probe 2010 can electrically contact the bypass pads 120 to test a memory chip.

Figure 22:
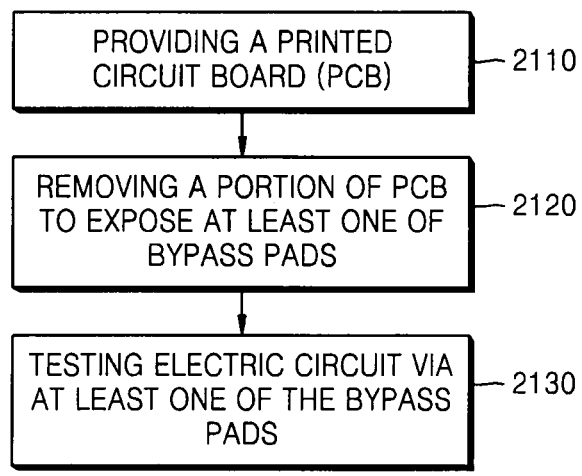
FIG. 22 is a diagram of a method of testing an electronic device according to some embodiments of the present inventive concept.

FIG. 22 is a diagram of a method of testing an electronic device according to some embodiments of the present inventive concept.

Referring to FIG. 22, a method of testing an electronic device includes providing a PCB at step 2110. The PCB includes a plurality of external pads to be coupled with an external device and a plurality of bypass pads for testing an electric circuit. The external pads are exposed from an outer surface of the PCB. However, one or more of the bypass pads are not exposed from an outer surface of the PCB. The method further includes removing a portion of the PCB to expose at least one of the plurality of bypass pads at step 2120. Finally, the method includes testing the electric circuit via the at least one of the plurality of bypass pads at step 2130.

Figure 23:
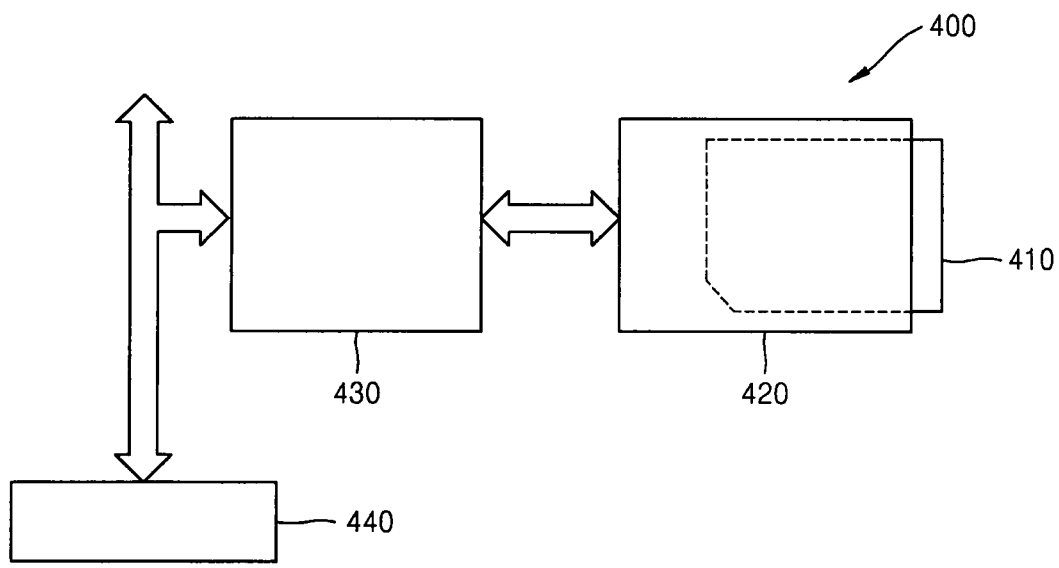
FIG. 23 is a diagram of a system using an electronic device according to some embodiments of the present inventive concept.

FIG. 23 is a diagram of a system using an electronic device according to embodiments of the present inventive concept.

Referring to FIG. 23, the system 400 includes a socket 420, an electronic device 410 including a PCB discussed with respect to the above embodiments, a card interface controller 430 and a host or an external device 440. The socket 420 can be provided to allow insertion and contact with the electronic device 410. The electronic device 410 can be, for example, a memory card. The socket 420 can be connected to external pads 115 (shown in, for example, FIG. 15) of the electronic device 410. The card interface controller 430 can control the exchange of data with the electronic device 410 through the socket 420. The card interface controller 430 can also be used to store data in the electronic device 410. The host 440 controls card interface controller 430.

FIG. 24 is a diagram of another system using an electronic device according to embodiments of the present inventive concept.

Referring to FIG. 24, a system 800 may, for example, include a processor 810, e.g., central processing unit (CPU) used in a personal computer, game machines, PDA or the like, a electronic device 820 made in accordance with any one of embodiments described above, an input/output device 830 and a bus 840. The input/output device 830 can be electrically coupled to the microprocessor 810 and the electronic device 820 (e.g., via the bus 840). Although not shown, a controller can be added to the system 800.

In one embodiment, the system 800 can be provided as part of a mobile phone, an MP3 player, a navigation device, solid state disk (SSD), household appliance, or the like.

Figure 25:
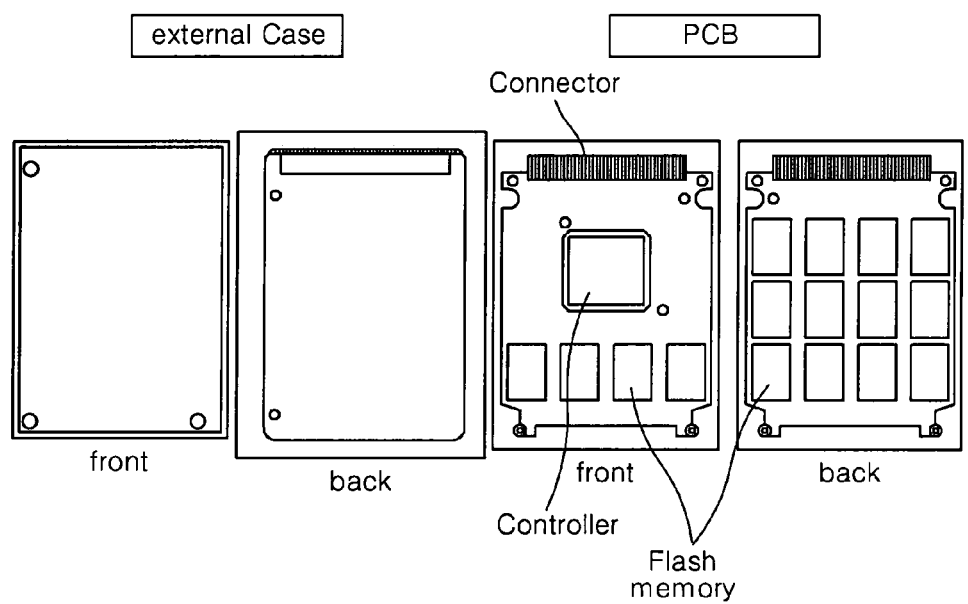
FIG. 25 shows photographs of a solid state disk (SSD) using an electronic device according to some embodiments of the present inventive concept.

FIG. 25 shows photographs of a solid state disk (SSD) using an electronic device according to embodiments of the present inventive concept. In particular, FIG. 25 shows front and back sides of an external case of SSD and also front and back sides a PCB to be placed in the external case. As shown, a controller and a connector are disposed in the front side while flash memories are placed on both sides of the PCB. However, the embodiments of the present invention are not limited to this specific structure and can be employed in other manners within the spirit and scope of the present invention. For example, the connector can be placed in other side of the PCB and the location of the connector can be placed depending on applications.

According to some embodiments of the present inventive concept, a printed circuit board (PCB) includes: a plurality of external pads to be coupled with an external device; and a plurality of bypass pads for testing an electric circuit. The external pads can be exposed from an outer surface of the PCB and one or more of the bypass pads may not be exposed from an outer surface of the PCB. The bypass pads may be contained wholly within the PCB. Also, the bypass pads and the external pads may be disposed adjacent to the same side of the PCB.

According to other embodiments of the present inventive concept, a printed circuit board (PCB) includes: a core insulator having a top surface and a bottom surface; bypass pads for testing an electrical circuit formed on the bottom surface of the core insulator; external pads to be coupled with an external device formed on the bottom surface of the core insulator; and a solder resist (SR) layer exposing the external pads and covering at least one of the bypass pads. Materials that make up the PCB may substantially surround the bypass pads. The bypass pads may be disposed in a region of the PCB in which all surfaces of the bypass pads are surrounded by the PCB. The SR layer may include openings respectively exposing corresponding ones of the bypass pads. The openings may be filled with a dielectric material having an etch selectivity with respect to the solder resist layer. The openings may be filled with an ACF. The dielectric material may be etched faster than the solder resist layer with respect to a predetermined etchant. The SR layer may have at least one opening exposing a portion of the bypass pads and the at least one opening may be filled with the dielectric material and the other portion of the at least one of the openings may be covered with the solder resist. Alternatively, the SR layer may include a single opening exposing a plurality of the bypass pads and the single opening may be filled with a dielectric material having an etch selectivity with respect to the SR layer, the dielectric material covering the plurality of the bypass pads. The PCB may further include another solder resist (SR) layer formed to cover the dielectric material and the SR layer having the openings.

According to still other embodiments of the present inventive concept, a device includes a PCB and a semiconductor chip overlying the PCB. The PCB may comprise: a core insulator having a top surface and a bottom surface; bypass pads for testing an electrical circuit formed on the bottom surface of the core insulator; external pads to be coupled with an external device formed on the bottom surface of the core insulator; and a solder resist exposing the external pads and covering at least one of the bypass pads. The semiconductor chip may include: a memory chip overlying the PCB; and a controller chip overlying the PCB. The device may be a storage device. The storage device may be an SSD or a memory card.

According to yet other embodiments of the present inventive concept, a system includes: a PCB substrate; a solder resist; a semiconductor memory chip; and at least one of a controller and a CPU. The PCB substrate includes: a core insulator having a top surface and a bottom surface; bypass pads for testing an electrical circuit formed on the bottom surface of the core insulator; and external pads to be coupled with an external device formed on the bottom surface of the core insulator. The solder resist exposes the external pads and covers at least one of the bypass pads.

According to another embodiment of the present inventive concept, a method includes: providing a printed circuit board (PCB) comprising a plurality of external pads to be coupled with an external device and a plurality of bypass pads for testing an electric circuit; removing a portion of the PCB to expose at least one of the plurality of bypass pads; and testing the electric circuit via the at least one of the plurality of bypass pads. The external pads are exposed and one or more of the bypass pads are not exposed to an outer surface of the PCB. The electric circuit may be a memory.

The PCB may include a solder resist layer and removing the portion of the PCB may include removing a portion of the solder resist layer to form at least one opening exposing the at least one of the plurality of bypass pads and forming an anisotropic conductive film (ACF) in the at least one opening. Testing the electric circuit may comprise contacting a test probe to the ACF.

According to yet another embodiment of the present inventive concept, a method of forming a printed circuit board (PCB), includes: providing a core insulator; forming external pads and bypass pads on a surface of the core insulator; and forming a solder resist layer on the surface of the core insulator. The solder resist layer exposes the external pads and covers at least one of the bypass pads. Forming the external pads and the bypass pads may include: forming a conductive material layer on the surface of the core insulator; and patterning the conductive material layer to form the external pads and the bypass pads. Forming the solder resist layer may include: forming a dielectric layer on the surface of the core insulator, the external pads, and the bypass pads; and patterning the dielectric layer to form the solder resist layer.

Reference throughout this specification to "one embodiment" or "an embodiment" means that a particular feature, structure, or characteristic described in connection with the embodiment is included in at least one embodiment of the present invention. Thus, the appearances of the phrases "in one embodiment," "in some embodiments, or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A solid state disk comprising:
a logic chip;
one or more memory chips; and
a printed circuit board including;
 a substrate including a first surface and a second surface opposite to the first surface;
 connector formed on the second surface of the substrate and configured to be coupled to external devices;
 a plurality of bypass pads; and
a solder resist layer covering the plurality of bypass pads formed on the second surface of the substrate.

2. The solid state disk of claim 1, wherein at least a portion of the second surface of the substrate is covered by the solder resist layer, and the logic chip and the one or more memory chips are disposed on the first surface of the substrate.

3. The solid state disk of claim 1, wherein at least a portion of the second surface of the substrate is covered by the solder resist layer, the logic chip is disposed on the first surface of the substrate, and the one or more memory chips are disposed on the first surface and the second surface of the substrate.

4. The solid state disk of claim 1, wherein at least a portion of the second surface of the substrate is covered by the solder resist layer, and the one or more memory chips are disposed on the first surface or the second surface of the substrate.

5. The solid state disk of claim 1, wherein the logic chip is disposed on the first surface, and the one or more memory chips are disposed on the first surface or the second surface of the substrate.

6. The solid state disk of claim 1, wherein the plurality of bypass pads are disposed closer to the second surface than to the first surface.

7. A solid state disk comprising:
a printed circuit board including:
 a substrate including a first surface and a second surface opposite to the first surface;
 a connector configured to be coupled to external devices and disposed on the second surface of the substrate;
 a plurality of bypass pads;
 and
 a solder resist layer formed on the second surface of the substrate and covering the plurality of bypass pads;
a controller disposed on the first surface of the substrate; and
one or more flash memory chips on the first surface or the second surface of the substrate.

8. An electronic device comprising:
a printed circuit board including:
 a substrate including a first surface and a second surface opposite to the first surface;
 a plurality of first-type terminal pads formed on the first surface of the substrate;
 a plurality of second-type terminal pads formed on the first surface of the substrate;
 a plurality of external pads formed on the second surface of the substrate and configured to be coupled to external devices;
 a plurality of bypass pads;
 a plurality of first-type circuit patterns electrically connecting the plurality of first-type terminal pads and the plurality of external pads;
 a plurality of second-type circuit patterns electrically connecting the plurality of second-type terminal pads and the plurality of bypass pads; and
 a solder resist layer formed on the second surface of the substrate and covering the plurality of bypass pads; and
one or more semiconductor devices disposed on the first surface of the substrate, each semiconductor device including:
 a plurality of first-type device pads, each of the plurality of first-type device pads being coupled to respective one of the plurality of first-type terminal pads; and
 a plurality of second-type device pads, each of the plurality of second-type device pads being coupled to respective one of the plurality of second-type terminal pads.

9. The electronic device of claim 8, further comprising an encapsulant covering the one or more semiconductor devices.

10. The electronic device of claim 8, further comprising a plurality of first-type bonding wires connecting the plurality of first-type device pads to the plurality of first-type terminal pads, and a plurality of second-type bonding wires connecting the plurality of second-type device pads to the plurality of second-type terminal pads.

11. The electronic device of claim 8, wherein the plurality of external pads are configured to transfer signals between the one or more semiconductor devices and the external devices.

12. The electronic device of claim 8, wherein the plurality of bypass pads are configured to test the one or more semiconductor devices.

13. The electronic device of claim 8, further comprising one or more passive devices on the first surface of the substrate, each of the passive devices being electrically connected to one or more of the plurality of bypass pads.

14. The electronic device of claim 8, wherein said one or more semiconductor devices comprise at least two semiconductor devices including a first semiconductor device and a second semiconductor device, the first semiconductor device being directly on the first surface of the substrate so that the first semiconductor device contacts the first surface of the substrate, the second semiconductor device being stacked on the first semiconductor device so that the second semiconductor device does not contact the first surface of the substrate.

15. The electronic device of claim 14, wherein the first semiconductor device is a memory device, and the second semiconductor device is a logic device.

16. The electronic device of claim 8, wherein said one or more semiconductor devices comprise at least two semiconductor devices including a first semiconductor device and a second semiconductor device, both of the first semiconductor device and the second semiconductor device being disposed directly on the first surface of the substrate so that each of the first semiconductor device and the second semiconductor device contacts the first surface of the substrate, the first semiconductor device being disposed closer to the plurality of external pads than to the plurality of bypass pads, the second semiconductor device being disposed closer to the plurality of bypass pads than to the plurality of external pads.

17. The electronic device of claim 16, wherein the first semiconductor device is a memory device, and the second semiconductor device is a logic device.

18. The electronic device of claim 16, wherein the first semiconductor device is a logic device, and the second semiconductor device is a memory device.

19. The electronic device of claim 8, wherein the solder resist layer completely covers the second surface of the substrate other than the plurality of external pads so that each of the plurality of external pads is exposed.

* * * * *